United States Patent [19]
Beasom

[11] Patent Number: 5,327,006
[45] Date of Patent: Jul. 5, 1994

[54] THIN, DIELECTRICALLY ISOLATED ISLAND RESIDENT TRANSISTOR STRUCTURE HAVING LOW COLLECTOR RESISTANCE

[75] Inventor: James D. Beasom, Melbourne, Fla.

[73] Assignee: Harris Corporation, Melbourne, Fla.

[21] Appl. No.: 755,314

[22] Filed: Sep. 5, 1991

Related U.S. Application Data

[63] Continuation of Ser. No. 461,715, Jan. 8, 1990, abandoned.

[51] Int. Cl.$^5$ ............................................. H01L 29/04
[52] U.S. Cl. .................................. 257/583; 257/524; 257/519
[58] Field of Search ................. 357/59; 257/583, 524, 257/519

[56] References Cited

U.S. PATENT DOCUMENTS

| | | | |
|---|---|---|---|
| 3,953,255 | 4/1976 | Combs, Jr. | 148/187 |
| 4,232,328 | 11/1980 | Hartman et al. | 357/49 |
| 4,868,624 | 9/1989 | Grung et al. | 357/34 |

Primary Examiner—Jerome Jackson
Assistant Examiner—Stephen D. Meier
Attorney, Agent, or Firm—Charles E. Wands

[57] ABSTRACT

The occupation area and thickness of dielectrically isolated island-resident transistor structures, which employ a buried subcollector for providing low collector resistance at the bottom of the island, are reduced by tailoring the impurity concentration of a reduced thickness island region to provide a low resistance current path from an island location directly beneath the base region to the collector contact. The support substrate is biased at a voltage which is less than the collector voltage, so that the portion of the collector (island) directly beneath the emitter projection onto the base is depleted of carriers prior to the electric field at that location reaching BCVEO, so as not to effectively reduce BVCEO. Since the support substrate bias potential depletes some of the region of the island beneath the base region of carriers, the doping of the island can be increased compared to the case where the substrate is not biased, while maintaining the electric field at this location less than the BVCEO field.

73 Claims, 7 Drawing Sheets

THIN, DIELECTRICALLY ISOLATED ISLAND RESIDENT TRANSISTOR STRUCTURE HAVING LOW COLLECTOR RESISTANCE

This is continuation of application Ser. No. 461,715, filed Jan. 8, 1990, now abandoned.

FIELD OF THE INVENTION

The present invention relates in general to semiconductor devices and is particularly directed to an improved high breakdown transistor structure formed in a thin dielectrically isolated region while retaining a low collector resistance.

BACKGROUND OF THE INVENTION

Figure 1:
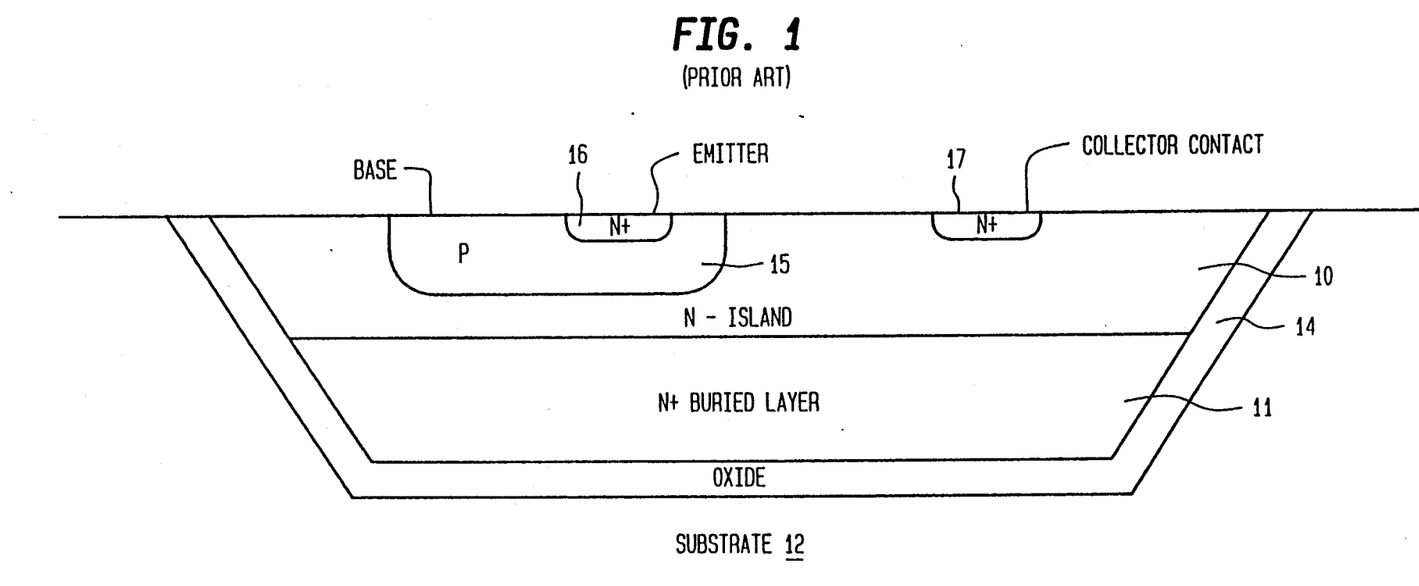
FIG. 1 diagrammatically illustrates the device structure of a conventional dielectrically isolated island region containing an NPN bipolar transistor having a high impurity concentration (N+) buried subcollector region.

Dielectrically isolated island structures are commonly employed in integrated circuit architectures for supporting a variety of circuit components, such as bipolar transistor devices, junction field effect devices, DMOS circuits, etc. In a typical (NPN) bipolar configuration, shown in FIG. 1, a high impurity concentration (N+) buried subcollector region 11 is formed at the bottom of an island (e.g. silicon) region 10 that is dielectrically isolated from a support substrate 12 (e.g. silicon) by means of a layer of insulator material (e.g. silicon oxide) 14 therebetween. The thickness of subcollector region 11 may be on the order of five to fifteen microns, depending on how heavily doped it is and to what magnitude of Dt product it is subjected during wafer processing. The thickness of the N− island 10, in the upper surface of which a P base region 15, an N+ emitter region 16 (formed in base region 15) and an N+ collector contact region 17 are formed, must be sufficiently large to support the base-collector depletion region layer without causing the peak field in the depletion layer to exceed the field at which the transistor goes into collector-emitter breakdown with the base open circuited, BVCEO. For a 100 V BVCEO NPN device having an HFE of 400, an N-thickness beneath the base, on the order of ten microns, is required. The minimum resistivity for such a device is about 10 ohm-cm. With a collector-base junction depth in the range of two to eight microns, minimum island thickness will therefore be relatively large (on the order of 22 microns) and therefor costly to manufacture.

The large size of such thick islands is also due to the fact that their sidewalls are sloped or inclined as a result of the application of an anisotropic etchant through a photolithographic mask the size of which defines the bottom of the island. The minimum front surface dimension of the finished island cannot be less that the minimum bottom dimension plus two times cot a times the island thickness, where a is the angle between the island sidewall and the island surface. This angle for typical dielectric isolation fabrication techniques using <100> oriented wafers is on the order of 55 degrees. As a consequence, in the case of the above-referenced island having a minimum thickness of 22 microns, the minimum island width will be 31 microns, plus a minimum bottom dimension on the order of 10 microns, yielding a minimum lateral island dimension of 41 microns for a 100 V buried layer NPN transistor. As this width is considerably greater than that normally attributed to small components, it effectively represents wasted space.

SUMMARY OF THE INVENTION

In accordance with the present invention, the considerable occupation area (and thickness) of transistor structures that achieve low collector resistance by means of a buried subcollector region at the bottom of the island is substantially reduced by means of a thin dielectrically isolated structure, in which the impurity concentration of the reduced thickness island region is tailored to provide a region of reduced resistance for providing a low resistance current path from an island location directly beneath the base region to the collector contact. In addition, the potential of the support substrate is established at a value which is less than the maximum collector voltage, so that the portion of the collector (island) directly beneath the base is depleted of carriers prior to the electric field at that location reaching the value that causes BVCEO breakdown, so as not to effectively reduce BCVEO. Since the support substrate bias potential depletes some of the region of the island beneath the base region of carriers, the doping of the island can be increased compared to the case where the substrate is not biased, while maintaining the electric field at this location less than the BVCEO field.

More particularly, in accordance with a first embodiment of the present invention, a bipolar transistor structure is formed within a dielectrically isolated region in a support substrate by forming a base region in a first surface portion of the island region, such that the semiconductor material of the island region extends beneath the base region and thereby separates a bottom portion of the base region from the bottom of the island region.

The support substrate may surround the dielectrically isolated island or may be configured as a semiconductor (silicon) on insulator architecture in which a channel of conductive (doped polysilicon) material dielectrically isolated from both the substrate and the island region is disposed adjacent to (the side surfaces of) the island region. The polysilicon channel may be biased at a voltage different from that of the substrate, because its bias does not influence the region beneath the base (as it is not a boundary to that region). As a consequence, unlike the depletion region-control substrate bias, the voltage applied to the polysilicon channel is not to be constrained.

An emitter region is formed in the base region and a collector contact is formed in a surface portion of the island region spaced apart from the base region. The impurity concentration of the island collector region is greater at its interface with the base region than at the bottom portion of the island, so as to provide a low collector resistance path through the collector from a location immediately beneath the base to the collector contact. In addition, the substrate is biased at a potential, relative to the potential of the collector island region, such that, in the presence of a voltage bias differential applied between the island region and the base, that portion of the collector region which extends beneath the base region and separates the bottom of the base from the bottom of the island region is depleted of carriers prior to the occurrence of a breakdown voltage field between the collector island region and the base.

Tailoring of the impurity concentration of the island region at its interface with the base region may be accomplished by introducing (ion implantation, diffusion) of impurities into the surface of the island region to form a higher (than the island) impurity region that extends from the surface of the island to a depth some defined distance deeper than the depth of the base, so that it extends beneath the bottom of the base region and above the bottom of the lower impurity concentration island region. The tailored doping may also extend completely through the island region, so that the island region acquires a graded impurity concentration profile decreasing from the surface of the island region and extending to a depth (e.g. its entire thickness) deeper than the depth of the base region. Again, the lowest impurity concentration of the collector island region occurs beneath the bottom of the base region.

Where a lower reduction in collector resistance can be tolerated as a tradeoff for purposes of gaining flexibility in choice of island thickness for a given BVCEO, the depth of the impurity concentration-tailoring region may be less than that of the base region, so that it terminates at a side portion of the base region.

In accordance with a second embodiment of the invention, reduced collector resistance is achieved by forming a semiconductor guard region of the same conductivity type as the base region, contiguous with and having a depth greater than that of the base region, so that the guard region effectively interrupts any surface path through the island to the collector contact region. The substrate is biased at potential, relative to that of the island region, such that a portion of the island region which extends beneath the base and separates the bottom of the base region from the bottom of the island region is depleted of carriers prior to the occurrence of a breakdown voltage field between the collector island region and the base region in the presence of a voltage bias differential applied between the island region and the base.

The deep guard region may be formed in the shape of a ring, contiguous with the lateral perimeter of the base, or it may be contiguous with one end of the base and extend across the width of the island region so as to intersect dielectric material through which the island region is dielectrically isolated from the substrate. Additionally, the second embodiment may be augmented by the addition of the impurity concentration-tailoring region of the first embodiment.

In accordance with a third embodiment of the invention, the above-described impurity concentration-tailoring region may be employed to reduce the resistance of the drain-drift region of a DMOS structure. In such a structure, the island region acts as the drain, with the channel being formed in a surface body region of opposite conductivity type with respect to the island. A drain contact region is formed in a surface portion of the island region spaced apart from the channel region. The source region is formed in the opposite conductivity type surface body region containing the channel. Overlying the channel is a gate insulator layer, the gate metal itself overlapping the source and island regions between which the channel is defined.

As in the first two embodiments, the resistance-reducing region extends from the surface of the island to some defined distance deeper than the depth of the channel-containing body region, so that it extends beneath the bottom of the channel-containing body region and body the bottom of the lower impurity concentration island region. Again, the lowest impurity concentration of the island region occurs beneath the bottom of the body region. The support substrate is biased at a voltage less than the drain voltage, so that the island region between the body region and the underlying support substrate becomes totally depleted of carriers before the breakdown field is reached in that region.

DETAILED DESCRIPTION

Figure 2:
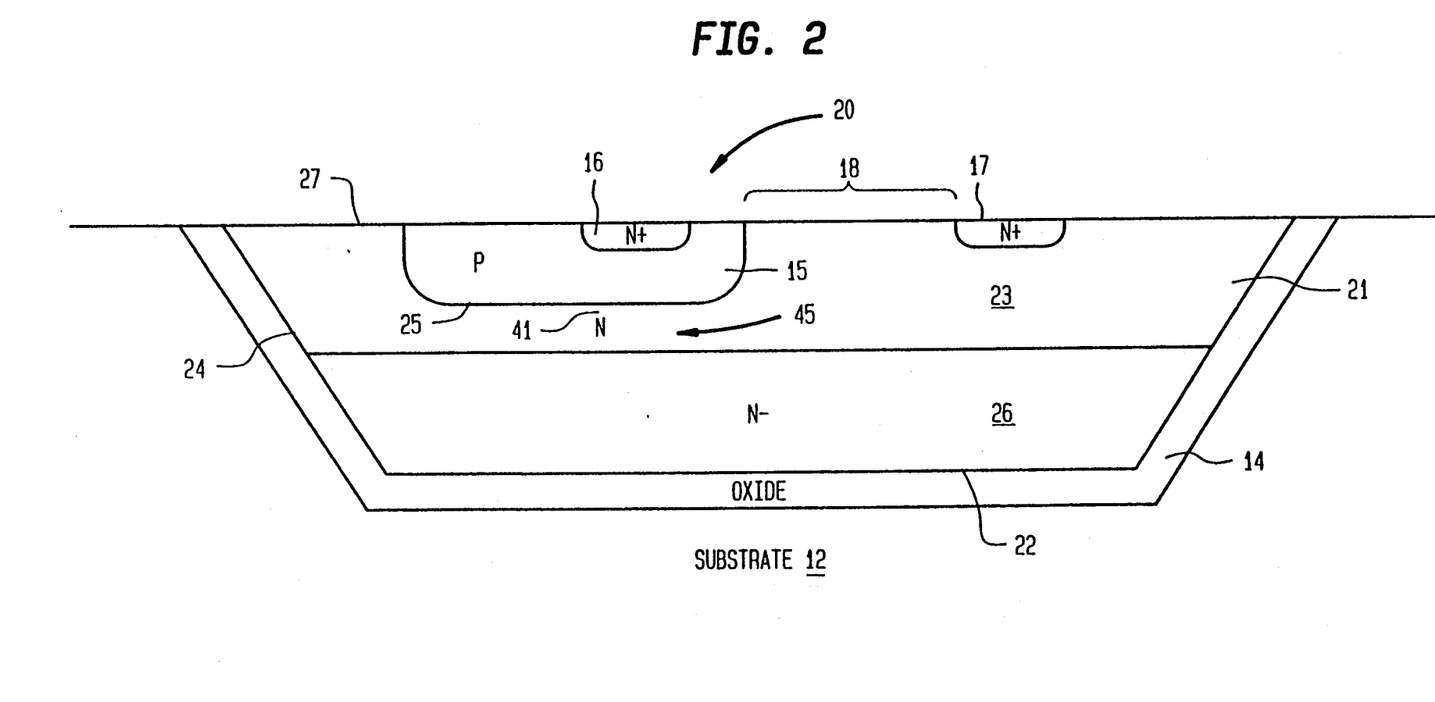
FIG. 2 diagrammatically illustrates a first embodiment of the present invention incorporated with a dielectrically isolated island containing an NPN bipolar transistor structure.

Referring now to FIG. 2 a first embodiment of the present invention is shown as comprising a bipolar (e.g. NPN) transistor structure 20 formed within an (N type silicon) island region 21 dielectrically isolated from a (silicon) support substrate 12 by means of an (oxide) insulator layer 14 at the bottom 22 and sidewalls 24 of island region 21. (It should be noted that the invention is not limited to a particular polarity type of device, an NPN structure being shown and described merely as an example.) As in the prior art configuration shown in FIG. 1, discussed above, transistor 20 contains a (P type) base region 15 disposed in a first surface portion of N island region 21, such that the semiconductor material of island region 21 extends beneath the bottom 25 of base region 15 and thereby separates the bottom 25 of the base region from the bottom 22 of the island region.

Figure 3:
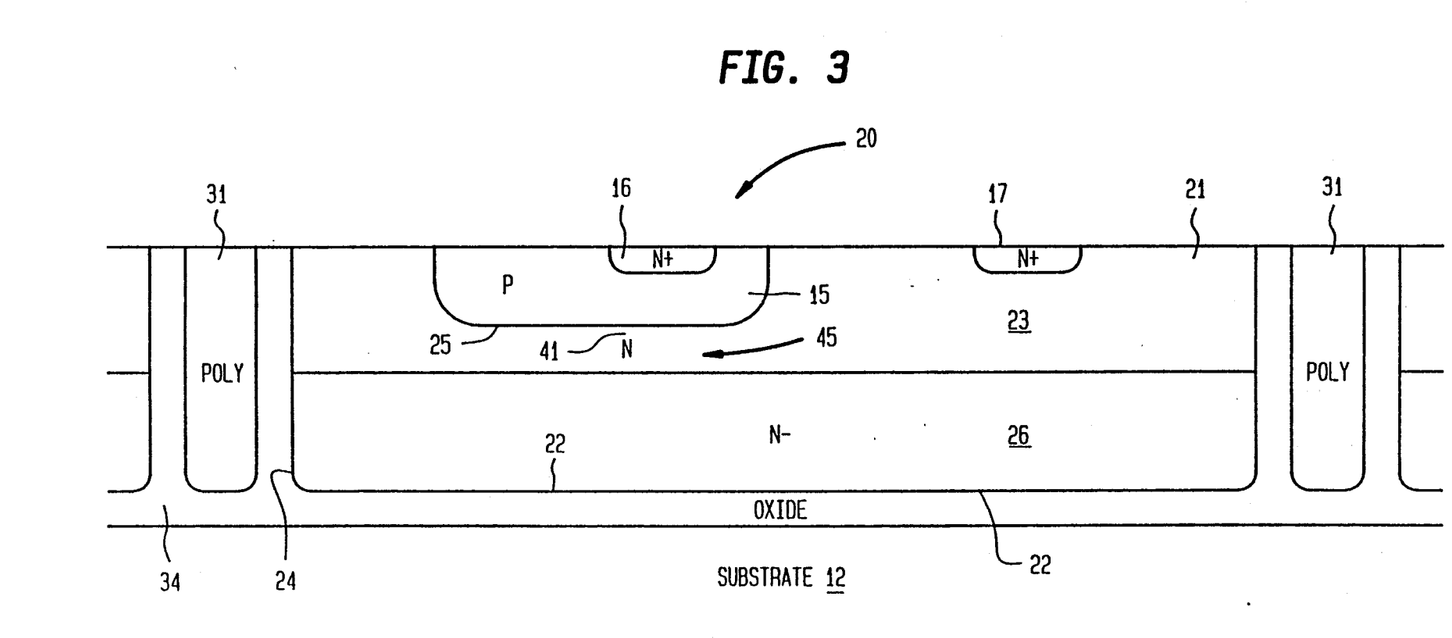
FIG. 3 shows the incorporation of the embodiment of FIG. 2 into an SOI architecture.

Support substrate 12 may surround dielectrically isolated island 21, as shown in FIG. 2, or it may be configured as a semiconductor (silicon) on insulator architecture, diagrammatically illustrated in FIG. 3 as having a channel 31 of conductive (doped polysilicon) material disposed adjacent to (the side surfaces of) island region 21 and dielectrically isolated from both substrate 12 and island region 21 by insulator layer 34. Polysilicon channel 31 may be biased at a voltage different from that of substrate 12, so that its bias does not influence that portion of island region 21 beneath base 15 (as the channel is not a boundary to that region). As a consequence, the voltage applied to the polysilicon channel need not be constrained.

NPN transistor 20 further includes an N+ emitter region 16 formed in a surface portion of base region 15, and an N+ collector contact region 17 formed in a surface portion of the island region spaced apart from base region 15 by a separation region 18 therebetween. In the embodiment illustrated in FIGS. 2 and 3, and unlike the prior art architecture of FIG. 1, an upper (N type) portion 23 of island region 21, which extends from the top surface 27 of the island to a depth beneath the bottom 25 of base region 15, has an impurity concentration which is greater at its interface with the base region than a lower (N−type) portion 26 adjacent to the bottom 22 of the island. Region 23 may be formed (by ion implant, diffusion) non-selectively, without the need for special masking, or it may be selectively introduced into only specified island regions within substrate 12, as required by a particular design.

As described previously, this relatively higher impurity concentration of upper portion 23 provides a low collector resistance path through the (collector) island from a location 41 within the collector island beneath that portion of base region 15 which underlies emitter region 16 through the N type material of the upper portion 23 of the island to collector contact region 17. Normally, at a given collector voltage, this region of increased doping would cause a higher electric field (resulting in a lower BVCEO) in the base-collector depletion layer that is formed in the portion 45 of island region 21 beneath base region 15 than would occur in the absence of the increased doping. This unwanted decrease in BVCEO is obviated by biasing substrate 12 at a potential, relative to the potential of the collector island region 21, such that, in the presence of a voltage bias differential applied between the island (collector) region 21 and emitter region 16, that portion 45 of the collector island region 21 which extends beneath base region 15 and separates the bottom 25 of the base from the bottom 22 of the island region 21 becomes depleted of carriers prior to the occurrence of a breakdown voltage field between the collector island region 21 and emitter region 16. Namely, because of the application of a substrate bias, that portion 41 of the region 45 beneath the base becomes depleted of carriers, so that its doping may be increased to a higher concentration than would be possible in the absence of a substrate bias, while maintaining the electric field at that location at less than the BVCEO field. When portion 45 of the collector island region 21 beneath base 15 is fully depleted by the combined action of the substrate bias and reverse base-collector junction bias prior to reaching the breakdown field, the collector voltage may be increased further until a breakdown field is reached in a lateral portion of the base-collector junction (away from region 45).

As pointed out above, and as depicted in the embodiment of FIGS. 2 and 3, the tailoring of the impurity concentration profile of island region 21 for providing a reduced resistance path between the base and the collector contact region 17 may be accomplished by introducing (ion implantation, diffusion) impurities into the upper surface 27 of the island region 21, so that higher (than the island) impurity concentration region 23 extends from the upper surface 27 of the island to a location some defined distance deeper than the depth of base region 15, whereby region 23 extends beneath the bottom 25 of the base region, yet still leaving a lower N-portion 26 of increased resistivity adjacent to the bottom 22 of island region 21.

Figure 4:
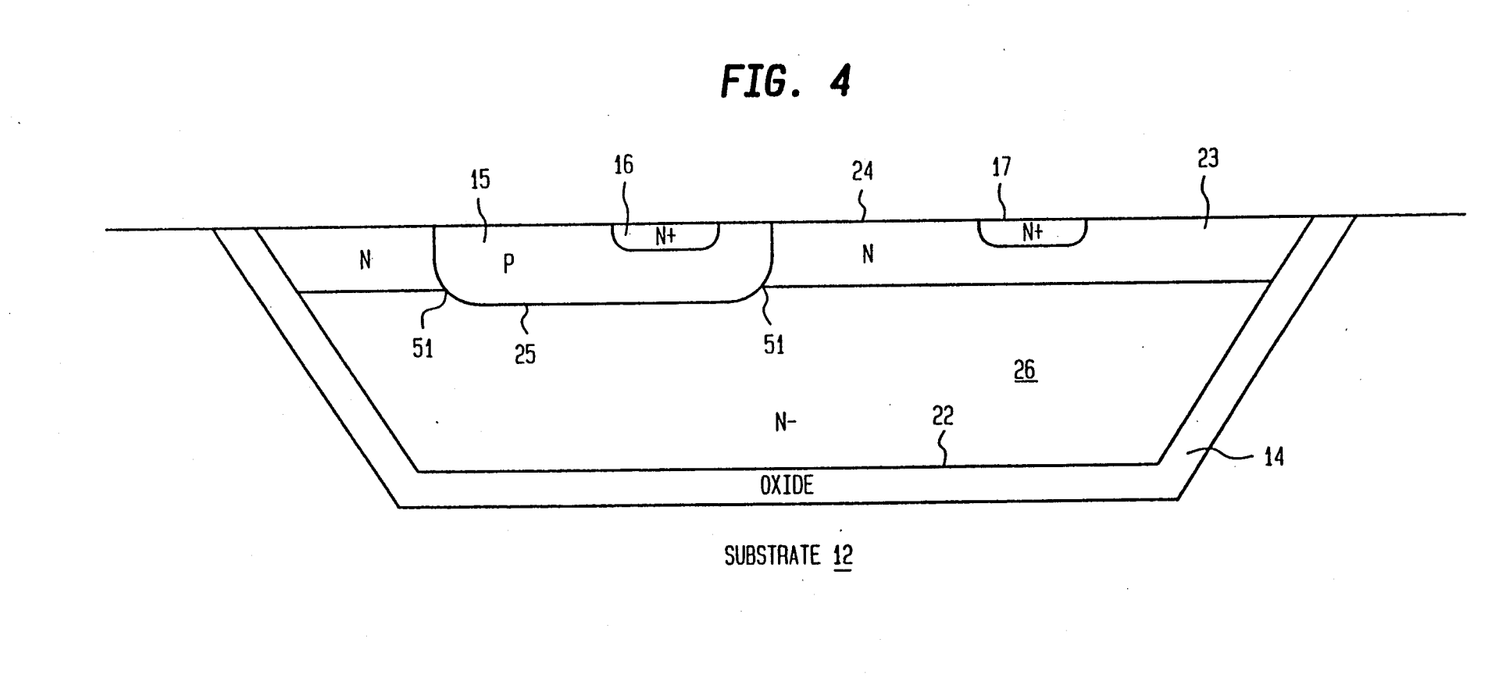
FIG. 4 shows a modification of the embodiment of the invention shown in FIG. 2, in which the depth of the impurity concentration-tailoring region is less than that of the base region.

This tailored doping may also extend completely through the island region, so that the island region acquires a graded impurity concentration profile decreasing from upper surface 27 and extending to bottom 22 of island region. Again, the upper part of the island will be more heavily doped, so that the lowest impurity concentration of the collector island region occurs beneath the bottom of the base region.

Where a lower reduction in collector resistance can be tolerated as a tradeoff for purposes of gaining flexibility in choice of island thickness for a given BVCEO, the depth of the impurity concentration-tailoring region 23 may be relatively shallow or less than that of base region 15, so that it terminates at a side portion 51 of the base region, as illustrated in the embodiment of FIG. 4.

Figure 5:
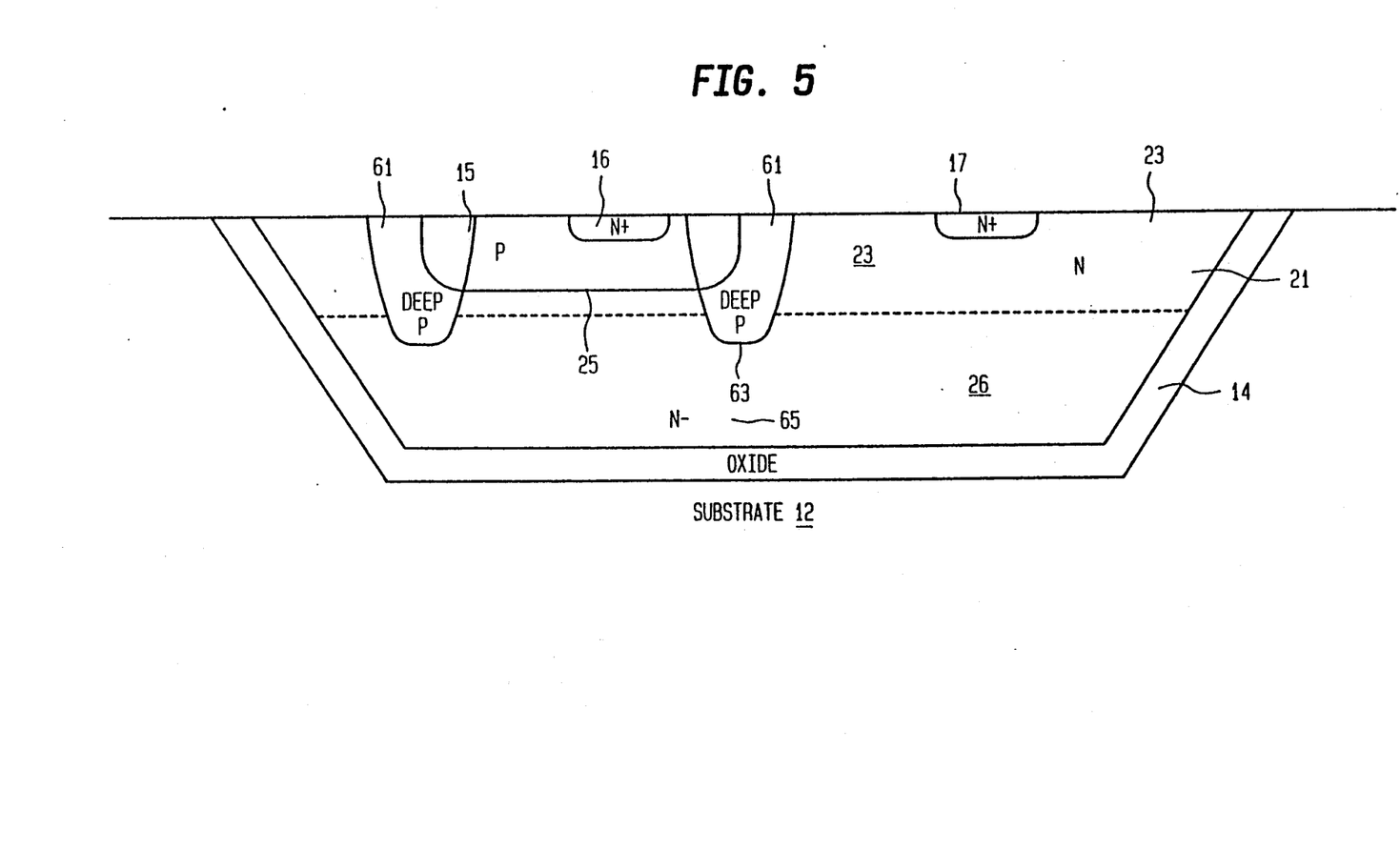
FIG. 5 shows a second embodiment of the invention having a deep semiconductor guard region contiguous with the base region.

In accordance with a second embodiment of the invention, diagrammatically illustrated in FIG. 5, reduced collector resistance is achieved by forming a deep semiconductor guard region 61 of the same conductivity type as, contiguous with and having a depth in collector island region 21 greater than that of base region 15, so that the deep guard region 61 effectively interrupts any surface path from that portion 41 of the collector island 21 underlying the emitter region 16 to collector contact region 17. Substrate 12 is biased at a voltage which is less than the collector voltage, such that the combined action of the base-collector bias and the substrate bias depletes that portion 65 of island region 21 between the bottom 63 of deep guard region 61 and the bottom 22 of island region 21 of carriers prior to the occurrence of a breakdown voltage field between the collector island region and the base region. Once a depletion region has been formed between the substrate and deep guard region 61, a further increase in the base-collector voltage will cause little change in the field underlying the emitter region 16 (namely within the confines of the deep P type guard region, due to the screening action of the depletion region. As a consequence, collector-to-emitter voltage can be increased further, thereby achieving a higher BVCEO than would otherwise be obtainable in a collector of the same doping and thickness.

Figure 6:
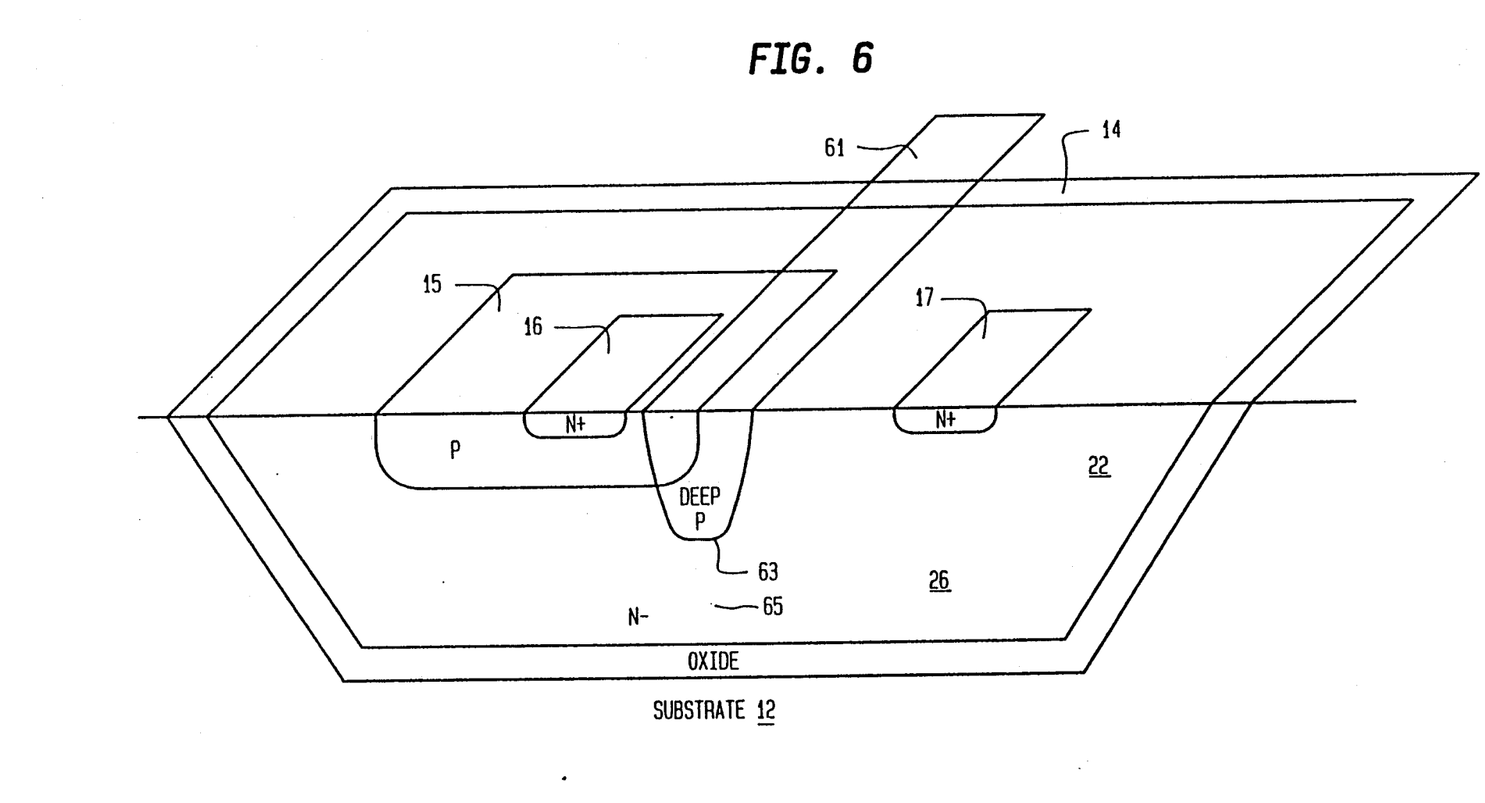
FIG. 6 is a sectional perimeter of a version of the second embodiment of the invention having a deep guard region.

To provide such a surrounding screen, deep guard region 61 may be formed in the shape of a ring contiguous with the lateral perimeter of the base, as indicated in FIG. 5. It may also be formed so as to be contiguous with one end of base region 15 and extend across the width of the island region 21, so as to intersect dielectric material 14 through which the island region is dielectrically isolated from the substrate 12, as shown by the sectional perspective illustration of FIG. 6. Collector resistance is kept low because thicker or more heavily doped islands (which have lower collector resistance) can be used to achieve the desired BVCEO due to the deep P screening effect.

In addition, this second embodiment may be augmented by the introduction of the impurity concentration-tailoring region 23, described above. Preferably, N region 23 is no deeper than guard region 61, as shown in broken lines in FIGS. 5 and 6, so that a depletion region is formed between the guard region 61 and the substrate 12 at the lowest possible voltage.

Figure 7:
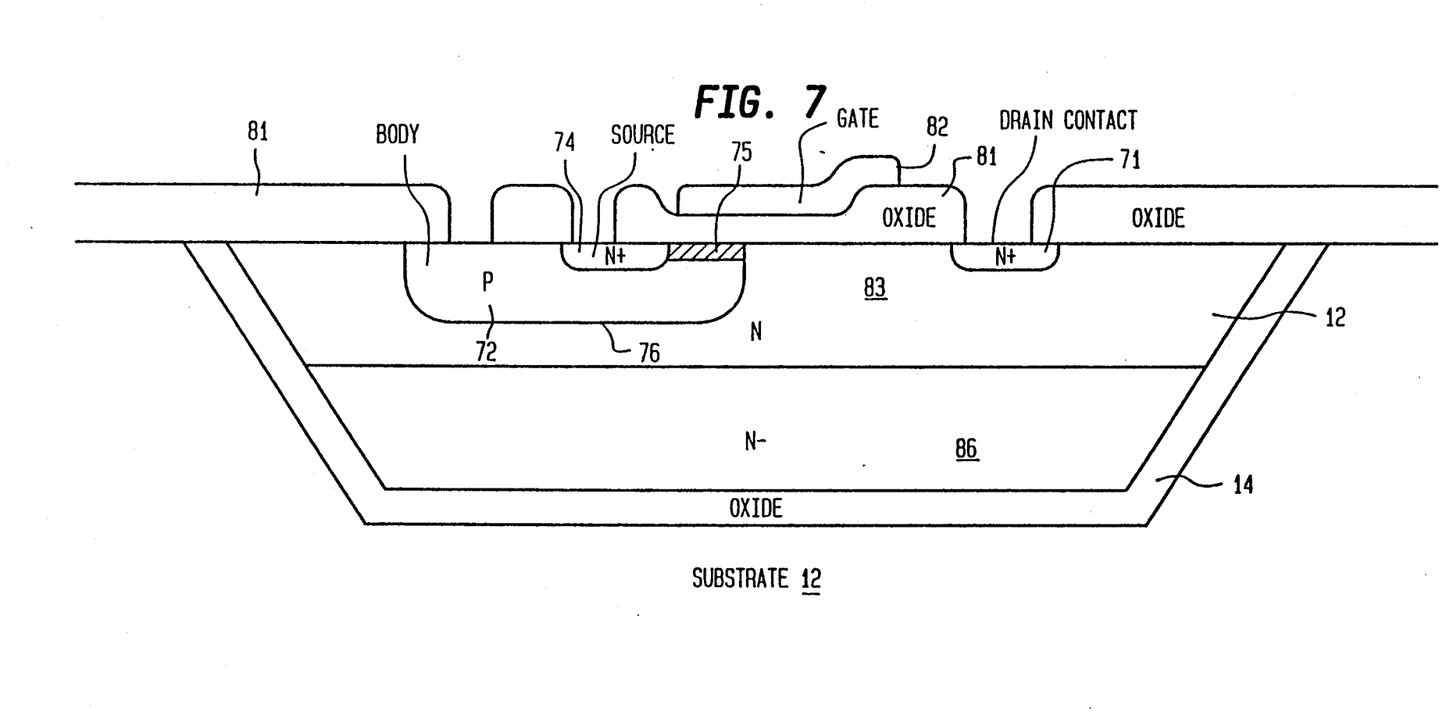
FIG. 7 shows a third embodiment of the invention, for reducing the resistance of the drain-drift region of a DMOS structure.

In accordance with a third embodiment of the invention, the above-described impurity concentration-tailoring region may be employed to reduce the resistance of the drain-drift region of a DMOS structure, diagrammatically illustrated in FIG. 7 as comprising additional surface insulator and gate electrode structure. More particularly, in the DMOS device shown in FIG. 7, N island region 21 acts as the drain, having an N+ surface drain contact region 71. A channel-containing P type body region 72 is formed in a surface portion of the island spaced apart from the drain contact 71. An N+ source region 74 is formed in a surface portion of body region 72 so as define the width of the channel region 75 between the island 21 and the body region 72. Overlying the channel is a thin gate insulator (oxide) layer 81. A layer of gate conductor material (e.g. doped polysilicon, metal) 82 is formed on the gate insulator layer and overlaps the source region 74 and island region 21, so as to extend over channel region 75.

As in the first two embodiments, a (drain drift) resistance-reducing region 83 extends from the top surface 84 of the island to some defined distance deeper than the depth of the channel-containing body region 72, so that it extends beneath the bottom 76 of the channel-containing body region and above the bottom 22 of the lower impurity concentration island region. Again, the lowest impurity concentration of the island region occurs beneath the bottom of the body region. The support substrate is biased at a voltage less than the drain voltage, so that the island region between the body region and the underlying support substrate becomes totally depleted of carriers before the breakdown field is reached in that region.

In each of the foregoing embodiments, biasing of the substrate 12 may be accomplished by means of an ohmic contact to the substrate or by a non-mechanical coupling mechanism, as long as the substrate assumes a voltage less than the voltage of the collector (island), so that the region between the base (or channel body in the case of a DMOS device), and the substrate is fully depleted before a breakdown field is reached. Such noncontact biasing of the substrate may be effected by leakage current equalization (net current to the substrate must be zero) or capacitive coupling. Either technique will establish a substrate bias that is intermediate the most negative and most positive voltages applied to the integrated circuit.

As will be appreciated from the foregoing description of the present invention, the considerable occupation area (and thickness) of transistor structures that achieve low collector resistance by means of a buried subcollector region at the bottom of the island is substantially reduced by means of a thin dielectrically isolated island structure, in which the impurity concentration of the reduced thickness island region is tailored to provide a region of reduced resistance for providing a low resistance current path from an island location directly beneath the emitter region to the collector contact. In addition, the potential of the support substrate is established at a value which is less than the collector voltage, so that the portion of the collector (island) directly beneath the emitter projection onto the base is depleted of carriers prior to the electric field at that location reaching BVCEO, so as not to effectively reduce BVCEO. Since the support substrate bias potential depletes some of the region of the island beneath the base region of carriers, the doping of the island can be increased compared to the case where the substrate is not biased, while maintaining the electric field at this location less than the BVCEO field.

While I have shown and described several embodiments in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A semiconductor device comprising:
    a semiconductor substrate having a dielectrically isolated island region of semiconductor material of a first conductivity type;
    a first semiconductor region of a second conductivity type, opposite to said first conductivity type, formed in a first surface portion of said island region, such that semiconductor material of said first conductivity type of said island region extends beneath said first semiconductor region and thereby separates a bottom portion of said first semiconductor region from a bottom portion of said island region, and wherein said island region has an impurity concentration which is greater at an interface with said first semiconductor region than at said bottom portion of said island region;
    a second semiconductor region of said first conductivity type, formed in a first surface portion of said first semiconductor region; and
    wherein said substrate is biased at a first bias voltage, said island region is biased at a second bias voltage, and said first semiconductor region is biased at a third bias voltage, said second and third bias voltages establishing a reverse bias voltage differential between said island region and said first semiconductor region, said first, second and third bias voltages being such that a portion of said island region which extends beneath said first semiconductor region and separates a bottom portion of said first semiconductor region from a bottom portion of said island region is depleted of carriers prior to the occurrence of a breakdown voltage field between said island region and said first semiconductor region.

2. A semiconductor device according to claim 1, wherein said island region has a graded impurity concentration profile decreasing from the surface of said island region and extending to a depth deeper than a depth of said first semiconductor region in said island region, so that the lowest impurity concentration of said island region occurs beneath the bottom of said first semiconductor region.

3. A semiconductor device according to claim 2, wherein the entire thickness of said island region has said graded impurity concentration profile.

4. A semiconductor device according to claim 1, wherein said island region includes a third semiconductor region of said first conductivity type disposed beneath said greater impurity portion of said island region and having an impurity concentration less than that of said greater impurity concentration portion.

5. A semiconductor device comprising:
    a semiconductor substrate having a dielectrically isolated island region of semiconductor material of a first conductivity type;
    a first semiconductor region of a second conductivity type, opposite to said first conductivity type, formed in a first surface portion of said island region, such that semiconductor material of said first conductivity type of said island region extends beneath said first semiconductor region and thereby separates a bottom portion of said first semiconductor region from a bottom portion of said island region, and wherein said island region has an impurity concentration which is higher at a portion thereof contiguous with said first semiconductor region than at said bottom portion of said island region;

a second semiconductor region of said first conductivity type, formed in a first surface portion of said first semiconductor region;

a third semiconductor region of said second conductivity type, contiguous with and having a depth greater than that of said first semiconductor island region; and wherein said substrate is biased at a first bias voltage, said island region is biased at a second bias voltage, and said first semiconductor region is biased at a third bias voltage, said second and third bias voltages establishing a reverse bias voltage differential between said island region and said first semiconductor region, said first, second and third bias voltages being such that a portion of said island region which extends beneath said first semiconductor region and separates a bottom portion of said first semiconductor region from a bottom portion of said island region is depleted of carriers prior to the occurrence of a breakdown voltage field between said island region and said first semiconductor region.

6. A semiconductor device according to claim 5, wherein said third semiconductor region is formed in the shape of a ring, contiguous with the lateral perimeter of said first semiconductor region.

7. A semiconductor device according to claim 5, wherein the impurity concentration of said island region is higher at the top surface portion than at the bottom portion thereof.

8. A semiconductor device according to claim 5, further including a fourth semiconductor region of said first conductivity type and formed in said island region so as to be contiguous with the bottom of said first semiconductor region and having a depth less than a depth of said third semiconductor region, said fourth semiconductor region having an impurity concentration greater than that of the bottom portion of said island region.

9. A semiconductor device comprising:
 a semiconductor substrate having a dielectrically isolated island region of semiconductor material of a first conductivity type;
 a first semiconductor region of a second conductivity type, opposite to said first conductivity type, formed in a first surface portion of said island region, such that semiconductor material of said first conductivity type of said island region extends beneath said first semiconductor region and thereby separates a bottom portion of said first semiconductor region from a bottom portion of said island region, and wherein said island region has an impurity concentration which is higher at a portion thereof contiguous with said first semiconductor region than at the bottom of said island region;
 a second semiconductor region of said first conductivity type, formed in a first surface portion of said first semiconductor region;
 a third semiconductor region of said first conductivity type and an impurity concentration greater than that of said island region formed in a second surface portion of said island region, spaced apart from said first surface portion thereof by a third surface portion of said island region therebetween;
 a fourth semiconductor region of said second conductivity type, disposed in said third surface portion of said island region such that a surface path from said first semiconductor region to said third semiconductor region through a surface portion of said island region is interrupted by semiconductor material of said fourth semiconductor region, said fourth semiconductor region having a depth greater than a depth of said second semiconductor island region; and wherein said substrate is biased at a first bias voltage, said island region is biased at a second bias voltage, and said first semiconductor region is biased at a third bias voltage, said second and third bias voltages establishing a reverse bias voltage differential between said island region and said first and fourth semiconductor regions, said first, second and third bias voltages being such that a portion of said island region which extends beneath said fourth semiconductor region and separates a bottom portion of said fourth semiconductor region from a bottom portion of said island region is depleted of carriers prior to the occurrence of a breakdown voltage field between said island region and said first semiconductor region.

10. A semiconductor device according to claim 9, wherein said forth semiconductor region is formed in the shape of a ring, contiguous with the lateral perimeter of said first semiconductor region.

11. A semiconductor device according to claim 10, wherein the impurity concentration of said island region is higher at the top surface portion than at the bottom thereof.

12. A semiconductor device according to claim 9, further including a fifth semiconductor region of said first conductivity type and formed in said island region so as to be contiguous with the bottom of said first semiconductor region and having a depth less than a depth of said fourth semiconductor region, said fifth semiconductor region having an impurity concentration greater than that of the bottom portion of said island region.

13. A semiconductor device according to claim 9, wherein said fourth semiconductor region intersects dielectric material through which said island region is dielectrically isolated from said substrate.

14. A semiconductor device according to claim 9, wherein said fourth semiconductor region is contiguous with an end portion of said first semiconductor region.

15. A semiconductor device comprising:
 a semiconductor substrate having a dielectrically isolated island region of semiconductor material of a first conductivity type;
 a first semiconductor region of a second conductivity type, opposite to said first conductivity type, formed in a first surface portion of said island region, such that semiconductor material of said first conductivity type of said island region extends beneath said first semiconductor region and thereby separates a bottom portion of said first semiconductor region from a bottom portion of said island region, and wherein said island region has an impurity concentration which is greater at an interface with said first semiconductor region than at said bottom portion of said island region;
 a second semiconductor region of said first conductivity type, formed in a first surface portion of said first semiconductor region;
 a third semiconductor region of said conductivity type and an impurity concentration greater than that of said island region formed in a second surface portion of said island region, spaced apart from said first surface portion thereof by a third surface portion of said island region therebetween;

wherein said substrate is biased at a first bias voltage, said island region is biased at a second bias voltage, and said first semiconductor region is biased at a third bias voltage, said second and third bias voltages establishing a reverse bias voltage differential between said island region and said first semiconductor region, said first, second and third bias voltages being such that a portion of said island region which extends beneath said first semiconductor region and separates a bottom portion of said first semiconductor region from a bottom portion of said island region is depleted of carriers prior to the occurrence of a breakdown voltage field between said island region and said first semiconductor region;

an insulator layer formed on said third surface portion of said island region and overlapping the first and second surface portions of said island region; and a conductive layer formed on said insulator layer.

16. A semiconductor device according to claim 15, wherein said conductive layer overlies a portion of said second semiconductor region and said third portion of said island region.

17. A semiconductor device comprising:

a semiconductor substrate having a dielectrically isolated island region of semiconductor material of N conductivity type;

a first semiconductor region of P conductivity type, formed in a first surface portion of said island region, such that semiconductor material of said island region extends beneath said first semiconductor region and thereby separates a bottom portion of said first semiconductor region from a bottom portion of said island region, and wherein said island has an impurity concentration which is higher at a portion thereof contiguous with said first semiconductor region than at said bottom portion of said island region;

a second semiconductor region of N conductivity type, formed in a first surface portion of said first semiconductor region;

a third semiconductor region of P conductivity type, contiguous with and having a depth greater than that of said first semiconductor island region; and wherein said substrate is biased at a first bias voltage, said island region is biased at a second bias voltage, and said first semiconductor region is biased at a third bias voltage, said second and third bias voltages establishing a reverse bias voltage differential between said island region and said first semiconductor region, and wherein said first bias voltage is more negative than said second bias voltage.

18. A semiconductor device according to claim 17, wherein the breakdown voltage between said island region and said first semiconductor region, when said first bias voltage is more negative than said second bias voltage, is higher than when said second bias voltage and said first bias voltage are substantially the same.

19. A semiconductor device comprising:

a semiconductor substrate having a dielectrically isolated island region of semiconductor material of P conductivity type;

a first semiconductor region of N conductivity type, formed in a first surface portion of said island region, such that semiconductor material of said island region extends beneath said first semiconductor region and thereby separates a bottom portion of said first semiconductor region from a bottom portion of said island region, and wherein said island region has an impurity concentration which is higher at a portion thereof contiguous with said first semiconductor region than at said bottom portion of said island region;

a second semiconductor region of P conductivity type, formed in a first surface portion of said first semiconductor region;

a third semiconductor region of N conductivity type, contiguous with and having a depth greater than that of said first semiconductor island region; and wherein said substrate is biased at a first bias voltage, said island region is biased at a second bias voltage, and said first semiconductor region is biased at a third bias voltage, said second and third bias voltages establishing a reverse bias voltage differential between said island region and said first semiconductor region, and wherein said first bias is more positive than said second bias voltage.

20. A semiconductor device according to claim 19, wherein the breakdown voltage between said island region and said first semiconductor region, when said first bias voltage is more positive than said second bias voltage, is higher than when said second bias voltage and said first voltage are substantially the same.

21. A semiconductor device comprising:

a semiconductor substrate having a dielectrically isolated island region of semiconductor material of N conductivity type;

a first semiconductor region of P conductivity type, formed in a first surface portion of said island region, such that semiconductor material of said island region extends beneath said first semiconductor region and thereby separates a bottom portion of said first semiconductor region from a bottom portion of said island region, and wherein said island region has an impurity concentration which is higher at a portion thereof contiguous with said first semiconductor region than at the bottom of said island region;

a second semiconductor region of N conductivity type, formed in a first surface portion of said first semiconductor region;

a third semiconductor region of N conductivity type and an impurity concentration greater than that of said island region formed in a second surface portion of said island region, spaced apart from said first surface portion thereof by a third surface portion of said island region therebetween;

a fourth semiconductor region of P conductivity type, disposed in said third surface portion of said island region such that a surface path from said first semiconductor region to said third semiconductor region through a surface portion of said island region is interrupted by semiconductor material of said fourth semiconductor region, said fourth semiconductor region having a depth greater than a depth of said second semiconductor island region; and wherein said substrate is biased at a first bias voltage, said island region is biased at a second bias voltage, and said first semiconductor region is biased at a third bias voltage, said second and third bias voltages establishing a reverse bias voltage differential between said island region and said first and fourth semiconductor regions, and wherein said first bias voltage is more negative than said second bias voltage.

22. A semiconductor device according to claim 21, wherein the breakdown voltage between said island region and said first and fourth semiconductor regions, where said first bias voltage is more negative than said second bias voltage, is higher than when said second bias voltage and said first bias voltage are substantially the same.

23. A semiconductor device comprising:
a semiconductor substrate having a dielectrically isolated island region of semiconductor material of P conductivity type;
a first semiconductor region of N conductivity type, formed in a first surface portion of said island region, such that semiconductor material of said island region extends beneath said first semiconductor region and thereby separates a bottom portion of said first semiconductor region from a bottom portion of said island region, and wherein said island region has an impurity concentration which is higher at a portion thereof contiguous with said first semiconductor region than at the bottom of said island region;
a second semiconductor region of P conductivity type, formed in a first surface portion of said first semiconductor region;
a third semiconductor region of P conductivity type and an impurity concentration greater than that of said island region formed in a second surface portion of said island region, spaced apart from said first surface portion thereof by a third surface portion of said island therebetween;
a fourth semiconductor region of N conductivity type, disposed in said third surface portion of said island region such that a surface path from said first semiconductor region to said third semiconductor region through a surface portion of said island region is interrupted by semiconductor material of said fourth semiconductor region, said fourth semiconductor region having a depth greater than a depth of said second semiconductor island region; and
wherein said substrate is biased at a first bias voltage, said island region is biased at a second bias voltage, and said first semiconductor region is biased at a third bias voltage, said second and third bias voltages establishing a reverse bias voltage differential between said island region and said first and fourth semiconductor regions, and wherein said first bias voltage is more positive than said second bias voltage.

24. A semiconductor device according to claim 23, wherein the breakdown voltage between said island region and said first and fourth semiconductor regions, when said first bias voltage is more positive than said second bias voltage, is higher than when said second bias voltage and said first bias voltage are substantially the same.

25. A semiconductor device comprising:
a semiconductor substrate having a dielectrically isolated island region of semiconductor material of a first conductivity type;
a first semiconductor region of a second conductivity type, opposite to said first conductivity type, formed in a first surface portion of said island region, such that semiconductor material of said first conductivity type of said island region extends beneath said first semiconductor region and thereby separates a bottom portion of said first semiconductor region from a bottom portion of said island region, and wherein said island region has an impurity concentration which is greater at an interface with said first semiconductor region than at said bottom portion of said island region;
a second semiconductor region of said first conductivity type, formed in a first surface portion of said first semiconductor region; and
wherein said substrate is biased at a first bias voltage, said island region is biased at a second bias voltage, and said first semiconductor region is biased at a third bias voltage, said second and third bias voltages establishing a reverse bias voltage differential between said island region and said first semiconductor region, said first, second and third bias voltages being such that a portion of said island region which extends beneath said first semiconductor region and separates a bottom portion of said first semiconductor region from a bottom portion of said island region is depleted of carriers prior to the occurrence of a breakdown voltage field between said island region and said first semiconductor region,
further including a channel of material dielectrically isolated from said substrate and said island region, disposed adjacent to said island region.

26. A semiconductor device according to claim 25, wherein said channel of material is biased at a fourth voltage different from said first bias voltage of said substrate.

27. A semiconductor device according to claim 25, wherein said island region has a graded impurity concentration profile decreasing from the surface of said island region and extending to a depth deeper than a depth of said first semiconductor region in said island region, so that the lowest impurity concentration of said island region occurs beneath the bottom of said first semiconductor region.

28. A semiconductor device according to claim 27, wherein the entire thickness of said island region has said graded impurity concentration profile.

29. A semiconductor device according to claim 25, wherein said island region includes a third semiconductor region of said first conductivity type disposed beneath said greater impurity portion of said island region and having an impurity concentration less than that of said greater impurity concentration portion.

30. A semiconductor device comprising:
a semiconductor substrate having a dielectrically isolated island region of semiconductor material of a first conductivity type;
a first semiconductor region of a second conductivity type, opposite to said first conductivity type, formed in a first surface portion of said island region, such that semiconductor material of said first conductivity type of said island region extends beneath said first semiconductor region and thereby separates a bottom portion of said first semiconductor region from a bottom portion of said island region, and wherein said island region has an impurity concentration which is higher at a portion thereof contiguous with said first semiconductor region that at said bottom portion of said island region;

a second semiconductor region of said first conductivity type, formed in a first surface portion of said first semiconductor region;

a third semiconductor region of said second conductivity type, contiguous with and having a depth greater than that of said first semiconductor island region; and wherein said substrate is biased at a first bias voltage, said island region is biased at a second bias voltage, and said first semiconductor region is biased at a third bias voltage, said second and third bias voltages establishing a reverse bias voltage differential between said island region and said first semiconductor region, said first, second and third bias voltages being such that a portion of said island region which extends beneath said first semiconductor region and separates a bottom portion of said first semiconductor region from a bottom portion of said island region is depleted of carriers prior to the occurrence of a breakdown voltage field between said island region and said first semiconductor region, further including a channel of material dielectrically isolated from said substrate and said island region, disposed adjacent to said island region.

31. A semiconductor device according to claim 30, wherein said channel of material is biased at a fourth voltage different from said first bias voltage of said substrate.

32. A semiconductor device according to claim 30, wherein said third semiconductor region is formed in the shape of a ring, contiguous with the lateral perimeter of said first semiconductor region.

33. A semiconductor device according to claim 30, wherein the impurity concentration of said island region is higher at the top surface portion than at the bottom portion thereof.

34. A semiconductor device according to claim 30, further including a fourth semiconductor region of said first conductivity type and formed in said island region so as to be contiguous with the bottom of said first semiconductor region and having a depth less than a depth of said third semiconductor region, said fourth semiconductor region having an impurity concentration greater than that of the bottom portion of said island region.

35. A semiconductor device comprising:

a semiconductor substrate having a dielectrically isolated island region of semiconductor material of a first conductivity type;

a first semiconductor region of a second conductivity type, opposite to said first conductivity type, formed in a first surface portion of said island region, such that semiconductor material of said first conductivity type of said island region extends beneath said first semiconductor region and thereby separates a bottom portion of said first semiconductor region from a bottom portion of said island region, and wherein said island region has an impurity concentration which is higher at a portion thereof contiguous with said first semiconductor region than at the bottom of said island region;

a second semiconductor region of said first conductivity type, formed in a first surface portion of said first semiconductor region;

a third semiconductor region of said first conductivity type and an impurity concentration greater than that of said island region formed in a second surface portion of said island region, spaced apart from said first surface portion thereof by a third surface portion of said island therebetween;

a fourth semiconductor region of said second conductivity type, disposed in said third surface portion of said island region such that a surface path from said first semiconductor region to said third semiconductor region through a surface portion of said island region is interrupted by semiconductor material of said fourth semiconductor region, said fourth semiconductor region having a depth greater than a depth of said second semiconductor island region; and wherein said substrate is biased at a first bias voltage, said island region is biased at a second bias voltage, and said first semiconductor region is biased at a third bias voltage, said second and third bias voltages establishing a reverse bias voltage differential between said island region and said first and fourth semiconductor regions, said first, second and third bias voltages being such that a portion of said island region which extends beneath said fourth semiconductor region and separates a bottom portion of said fourth semiconductor region from a bottom portion of said island region is depleted of carriers prior to the occurrence of a breakdown voltage field between said island region and said first semiconductor region, further including a channel of material dielectrically isolated from said substrate and said island region, disposed adjacent to said island region.

36. A semiconductor device according to claim 35, wherein said channel of material is biased at a fourth voltage different from said first bias voltage of said substrate.

37. A semiconductor device according to claim 35, wherein said fourth semiconductor region is formed in the shape of a ring, contiguous with the lateral perimeter of said first semiconductor region.

38. A semiconductor device according to claim 37, wherein the impurity concentration of said island region is higher at the top surface portion than at the bottom portion thereof.

39. A semiconductor device according to claim 35, further including a fifth semiconductor region of said first conductivity type and formed in said island region so as to be contiguous with the bottom of said first semiconductor region and having a depth less than a depth of said fourth semiconductor region, said fifth semiconductor region having an impurity concentration greater than that of the bottom portion of said island region.

40. A semiconductor device according to claim 35, wherein said fourth semiconductor region intersects dielectric material through which said island region is dielectrically isolated from said substrate.

41. A semiconductor device according to claim 35, wherein said fourth semiconductor region is contiguous with an end portion of said first semiconductor region.

42. A semiconductor device comprising:

a semiconductor substrate having a dielectrically isolated island region of semiconductor material of a first conductivity type;

a first semiconductor region of a second conductivity type, opposite to said first conductivity type, formed in a first surface portion of said island region, such that semiconductor material of said first conductivity type of said island region extends beneath said first semiconductor region and thereby separates a bottom portion of said first semiconductor region from a bottom portion of said island region, and wherein said island region has an impurity concentration which is greater at an interface with said first semiconductor region than at said bottom portion of said island region;

a second semiconductor region of said first conductivity type, formed in a first surface portion of said first semiconductor region;

a third semiconductor region of said first conductivity type and an impurity concentration greater than that of said island region formed in a second surface portion of said island region, spaced apart from said first surface portion thereof by a third surface portion of said island region therebetween;

wherein said substrate is biased at a first bias voltage, said island region is biased at a second bias voltage, and said first semiconductor region is biased at a third bias voltage, said second and third bias voltages establishing a reverse bias voltage differential between said island region and said first semiconductor region, said first, second and third bias voltages being such that a portion of said island region which extends beneath said first semiconductor region and separates a bottom portion of said first semiconductor region from a bottom portion of said island region is depleted of carriers prior to the occurrence of a breakdown voltage field between said island region and said first semiconductor region;

an insulator layer formed on said third surface portion of said island region and overlapping the first and second surface portions of said island region; and a conductive layer formed on said insulator layer, further including a channel of material dielectrically isolated from said substrate and said island region, disposed adjacent to said island region.

43. A semiconductor device according to claim 42, wherein said channel of material is biased at fourth voltage different from said first bias voltage of said substrate.

44. A semiconductor device according to claim 42, wherein said conductive layer overlies a portion of said second semiconductor region and said third portion of said island region.

45. A semiconductor device comprising:
a semiconductor substrate having a dielectrically isolated island region of semiconductor material of N conductivity type;
a first semiconductor region of P conductivity type, formed in a first surface portion of said island region, such that N type semiconductor material of said island region extends beneath said first semiconductor region and thereby separates a bottom portion of said first semiconductor region from a bottom portion of said island region, and wherein said island region has an impurity concentration which is greater at an interface with said first semiconductor region than at said bottom portion of said island region;
a second semiconductor region of N conductivity type, formed in a first surface portion of said first semiconductor region; and
wherein said substrate is biased at a first bias voltage, said island region is biased at a second bias voltage, and said first semiconductor region is biased at a third bias voltage, said second and third bias voltages establishing a reverse bias voltage differential between said island region and said first semiconductor region, and wherein said first bias voltage is more negative than said second bias voltage,
further including a channel of material dielectrically isolated from said substrate and said island region, disposed adjacent to said island region.

46. A semiconductor device according to claim 45, wherein said channel of material is biased at a fourth voltage different from said first bias voltage of said substrate.

47. A semiconductor device according to claim 45, wherein the breakdown voltage between said island region and said first semiconductor region, when said first bias voltage is more negative than said second bias voltage, is higher than when said second bias voltage and said first bias voltage are substantially the same.

48. A semiconductor device comprising:
a semiconductor substrate having a dielectrically isolated island region of semiconductor material of P conductivity type;
a first semiconductor region of N conductivity type, formed in a first surface portion of said island region, such that P type semiconductor material of said island region extends beneath said first semiconductor region and thereby separates a bottom portion of said first semiconductor region from a bottom portion of said island region, and wherein said island region has an impurity concentration which is greater at an interface with said first semiconductor region than at said bottom portion of said island region;
a second semiconductor region of P conductivity type, formed in a first surface portion of said first semiconductor region; and
wherein said substrate is biased at a first bias voltage, said island region is biased at a second bias voltage, and said first semiconductor region is biased at a third bias voltage, said second and third bias voltages establishing a reverse bias voltage differential between said island region and said first semiconductor region, and wherein said first bias voltage is more positive than said second bias voltage,
further including a channel of material dielectrically isolated from said substrate and said island region, disposed adjacent to said island region.

49. A semiconductor device according to claim 48, wherein said channel of material is biased at a fourth voltage different from said first bias voltage of said substrate.

50. A semiconductor device according to claim 48, wherein the breakdown voltage between said island region and said first semiconductor region, when said first bias voltage is more positive than said second bias voltage, is higher than when said second bias voltage and said first bias voltage are substantially the same.

51. A semiconductor device comprising:
a semiconductor substrate having a dielectrically isolated island region of semiconductor material of N conductivity type;
a first semiconductor region of P conductivity type, formed in a first surface portion of said island region, such that semiconductor material of said island region extends beneath said first semiconductor region and thereby separates a bottom portion of said first semiconductor region from a bottom portion of said island region, and wherein said island region has an impurity concentration which is higher at a portion thereof contiguous with said first semiconductor region than at said bottom portion of said island region;
a second semiconductor region of N conductivity type, formed in a first surface portion of said first semiconductor region;
a third semiconductor region of P conductivity type, contiguous with and having a depth greater than that of said first semiconductor island region; and
wherein said substrate is biased at a first bias voltage, said island region is biased at a second bias voltage, and said first semiconductor region is biased at a third bias voltage, said second and third bias voltages establishing a reverse bias voltage differential between said island region and said first semiconductor region, and wherein said first bias voltage is more negative than said second bias voltage,
further including a channel of material dielectrically isolated from said substrate and said island region, disposed adjacent to said island region.

52. A semiconductor device according to claim 51, wherein said channel of material is biased at a fourth voltage different from said first bias voltage of said substrate.

53. A semiconductor device according to claim 51, wherein the breakdown voltage between said island region and said first semiconductor region, when said first bias voltage is more negative than said second bias voltage, is higher than when said second bias voltage and said first bias voltage are substantially the same.

54. A semiconductor device comprising:
a semiconductor substrate having a dielectrically isolated island region of semiconductor material of P conductivity type;
a first semiconductor region of N conductivity type, formed in a first surface portion of said island region, such that semiconductor material of said island region extends beneath said first semiconductor region and thereby separates a bottom portion of said first semiconductor region from a bottom portion of said island region, and wherein said island region has an impurity concentration which is higher at a portion thereof contiguous with said first semiconductor region than at said bottom portion of said island region;
a second semiconductor region of P conductivity type, formed in a first surface portion of said first semiconductor region;
a third semiconductor region of N conductivity type, contiguous with and having a depth greater than that of said first semiconductor island region; and
wherein said substrate is biased at a first bias voltage, said island region is biased at a second bias voltage, and said first semiconductor region is biased at a third bias voltage, said second and third bias voltages establishing a reverse bias voltage differential between said island region and said first semiconductor region, and wherein said first bias voltage is more positive than said second bias voltage,
further including a channel of material dielectrically isolated from said substrate and said island region, disposed adjacent to said island region.

55. A semiconductor device according to claim 54, wherein said channel of material is biased at a fourth voltage different from said first bias voltage of said substrate.

56. A semiconductor device according to claim 54, wherein the breakdown voltage between said island region and said first semiconductor region, when said first bias voltage is more positive than said second bias voltage, is higher than when said second bias voltage and said first bias voltage are substantially the same.

57. A semiconductor device comprising:
a semiconductor substrate having a dielectrically isolated island region of semiconductor material of N conductivity type;
a first semiconductor region of P conductivity type, formed in a first surface portion of said island region, such that semiconductor material of said island region extends beneath said first semiconductor region and thereby separates a bottom portion of said first semiconductor region from a bottom portion of said island region, and wherein said island region has an impurity concentration which is higher at a portion thereof contiguous with said first semiconductor region than at the bottom of said island region;
a second semiconductor region of N conductivity type, formed in a first surface portion of said first semiconductor region;
a third semiconductor region of N conductivity type and an impurity concentration greater than that of said island region formed in a second surface portion of said island region, spaced apart from said first surface portion thereof by a third surface portion of said island region therebetween;
a fourth semiconductor region of P conductivity type, disposed in said third surface portion of said island region such that a surface path from said first semiconductor region to said third semiconductor region through a surface portion of said island region is interrupted by semiconductor material of said fourth semiconductor region, said fourth semiconductor region having a depth greater than a depth of said second semiconductor island region; and
wherein said substrate is biased at a first bias voltage, said island region is biased at a second bias voltage, and said first semiconductor region is biased at a third bias voltage, said second and third bias voltages establishing a reverse bias voltage differential between said island region and said first and fourth semiconductor regions, and wherein said first bias voltage is more negative than said second bias voltage,
further including a channel of material dielectrically isolated from said substrate and said island region, disposed adjacent to said island region.

58. A semiconductor device according to claim 57, wherein said channel of material is biased at a fourth voltage different from said first bias voltage of said substrate.

59. A semiconductor device according to claim 57, wherein the breakdown voltage between said island region and said first and fourth semiconductor regions, when said first bias voltage is more negative than said second bias voltage, in higher than when said second bias voltage and said first bias voltage are substantially the same.

60. A semiconductor device comprising:
a semiconductor substrate having a dielectrically isolated island region of semiconductor material of P conductivity type;

a first semiconductor region of N conductivity type, formed in a first surface portion of said island region, such that semiconductor material of said island region extends beneath said first semiconductor region and thereby separates a bottom portion of said first semiconductor region from a bottom portion of said island region, and wherein said island region has an impurity concentration which is higher at a portion thereof contiguous with said first semiconductor region than at the bottom of said island region;

a second semiconductor region of P conductivity type, formed in a first surface portion of said first semiconductor region;

a third semiconductor region of P conductivity type and an impurity concentration greater than that of said island region formed in a second surface portion of said island region, spaced apart from said first surface portion thereof by a third surface portion of said island region therebetween;

a fourth semiconductor region of N conductivity type, disposed in said third surface portion of said island region such that a surface path from said first semiconductor region to said third semiconductor region through a surface portion of said island region is interrupted by semiconductor material of said fourth semiconductor region, said fourth semiconductor region having a depth greater than a depth of said second semiconductor island region; and wherein said substrate is biased at a first bias voltage, said island region is biased at a second bias voltage, and said first semiconductor region is biased at a third bias voltage, said second and third bias voltages establishing a reverse bias voltage differential between said island region and said first and fourth semiconductor regions, and wherein said first bias voltage is more positive than said second bias voltage, further including a channel of material dielectrically isolated from said substrate and said island region, disposed adjacent to said island region.

61. A semiconductor device according to claim 60, wherein said channel of material is biased at a fourth voltage different from said first bias voltage of said substrate.

62. A semiconductor device according to claim 60, wherein the breakdown voltage between said island region and said first and fourth semiconductor regions, when said first bias voltage is more positive than said second bias voltage, is higher than when said second bias voltage and said first bias voltage are substantially the same.

63. A semiconductor device comprising:
a semiconductor substrate having a dielectrically isolated island region of semiconductor material of N conductivity type;
a first semiconductor region of P conductivity type, formed in a first surface portion of said island region, such that semiconductor material of said island region extends beneath said first semiconductor region and thereby separates a bottom portion of said first semiconductor region from a bottom portion of said island region, and wherein said island region has an impurity concentration which is greater at an interface with said first semiconductor region than at said bottom portion of said island region;

a second semiconductor region of N conductivity type, formed in a first surface portion of said first semiconductor region;

a third semiconductor region of N conductivity type and an impurity concentration greater than that of said island region formed in a second surface portion of said island region, spaced apart from said first surface portion thereof by a third surface portion of said island region therebetween;

wherein said substrate is biased at a first bias voltage, said island region is biased at a second bias voltage, and said first semiconductor region is biased at a third bias voltage, said second and third bias voltages establishing a reverse bias voltage differential between said island region and said first semiconductor region, and wherein said first bias voltage is more negative than said second bias voltage;

an insulator layer formed on said third surface portion of said island region and overlapping the first and second surface portions of said island region; and a conductive layer formed on said insulator layer, further including a channel of material dielectrically isolated from said substrate and said island region, disposed adjacent to said island region.

64. A semiconductor device according to claim 63, wherein said channel of material is biased at a fourth voltage different from said first bias voltage of said substrate.

65. A semiconductor device according to claim 63, wherein the breakdown voltage between said island region and said first semiconductor region, when said first bias voltage is more negative than said second bias voltage, is higher than when said second bias voltage and said first bias voltage are substantially the same.

66. A semiconductor device comprising:
a semiconductor substrate having a dielectrically isolated island region of semiconductor material of P conductivity type;
a first semiconductor region of N conductivity type, formed in a first surface portion of said island region, such that semiconductor material of said island region extends beneath said first semiconductor region and thereby separates a bottom portion of said first semiconductor region from a bottom portion of said island region, and wherein said island region has an impurity concentration which is greater at an interface with said first semiconductor region than at said bottom portion of said island region;

a second semiconductor region of P conductivity type, formed in a first surface portion of said first semiconductor region;

a third semiconductor region of P conductivity type and an impurity concentration greater than that of said island region formed in a second surface portion of said island region, spaced apart from said first surface portion thereof by a third surface portion of said island region therebetween;

wherein said substrate is biased at a first bias voltage, said island region is biased at a second bias voltage, and said first semiconductor region is biased at a third bias voltage, said second and third bias voltages establishing a reverse bias voltage differential between said island region and said first semiconductor region, and wherein said first bias voltage is more positive than said second bias voltage;

an insulator layer formed on said third surface portion of said island region and overlapping the first and second surface portions of said island region; and a conductive layer formed on said insulator layer, further including a channel of material dielectrically isolated from said substrate and said island region, disposed adjacent to said island region.

67. A semiconductor device according to claim 66, wherein said channel of material is biased at a fourth voltage different from said first bias voltage of said substrate.

68. A semiconductor device according to claim 66, wherein the breakdown voltage between said island region and said first semiconductor region, when said first bias voltage is more positive than said second bias voltage, is higher than when said second bias voltage and said first bias voltage are substantially the same.

69. A bipolar transistor device comprising:
a semiconductor substrate having a dielectrically isolated collector island region;
a base region formed in a first surface portion of said collector region, such that said collector region extends beneath said base and separates a bottom portion of said base region from a bottom portion of said collector island region, and wherein said collector island region has an impurity concentration which is greater at an interface with said base semiconductor region than at said bottom portion of said collector island region;
an emitter region formed in a first surface portion of said base region;
a first bias potential applied to said substrate; and
a second bias potential applied to said collector island region; and wherein said first and second bias potentials have respective values such that the value of BVCEO of the bipolar transistor is approximately equal to what its value would be absent the impurity concentration of said collector island region being higher at said interface with said base region than at the bottom portion of said collector island region, further including a channel of material dielectrically isolated from said semiconductor substrate and said collector island region, disposed adjacent to said collector island region.

70. A bipolar transistor device according to claim 69, wherein said channel of material is biased at a voltage different from that of said substrate.

71. A bipolar transistor device according to claim 69, wherein said base region has a first depth within said collector island region, said collector island region has a graded impurity concentration profile decreasing from the surface of said collector island region and extending to a second depth greater than said first depth of said base region in said collector island region, so that the lowest impurity concentration of said collector island region occurs beneath the bottom of said base region.

72. A bipolar transistor device according to claim 71, wherein the entire thickness of said collector island region has a graded impurity concentration profile.

73. A bipolar transistor device according to claim 69, wherein said collector island region includes a further semiconductor region having a conductivity type corresponding to that of said collector island region disposed beneath a greater impurity concentration portion of said collector island region and having an impurity concentration less than that of said greater impurity concentration portion.

* * * * *